(12) United States Patent
Meyer-Berg et al.

(10) Patent No.: US 7,176,131 B2
(45) Date of Patent: Feb. 13, 2007

(54) ELECTRONIC COMPONENT HAVING AT LEAST ONE SEMICONDUCTOR CHIP AND FLIP-CHIP CONTACTS, AND METHOD FOR PRODUCING THE SAME

(75) Inventors: Georg Meyer-Berg, München (DE); Barbara Vasquez, Lafayette, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/960,994

(22) Filed: Oct. 12, 2004

(65) Prior Publication Data

US 2005/0110162 A1 May 26, 2005

Related U.S. Application Data

(63) Continuation of application No. PCT/DE03/01150, filed on Apr. 8, 2003.

(30) Foreign Application Priority Data

Apr. 9, 2002 (DE) .............................. 102 15 654

(51) Int. Cl.
*H01L 21/44* (2006.01)
(52) U.S. Cl. ................ 438/675; 257/778; 257/E21.575; 438/584; 438/614; 438/617; 438/524; 438/666
(58) Field of Classification Search ................ 438/584, 438/614, 617, 624, 675, 666, 524; 257/778, 257/E21.575
See application file for complete search history.

(56) References Cited

U.S. PATENT DOCUMENTS

| | | | |
|---|---|---|---|
| 3,852,878 A | 12/1974 | Munro | |
| 3,986,912 A * | 10/1976 | Alcorn et al. | 438/713 |
| 4,070,501 A * | 1/1978 | Corbin et al. | 438/675 |
| 4,087,314 A * | 5/1978 | George et al. | 438/614 |
| 5,206,713 A | 4/1993 | McGeary | |
| 5,258,648 A | 11/1993 | Lin | |
| 5,364,276 A | 11/1994 | Inasaka | |
| 5,706,578 A | 1/1998 | Hübner | |
| 5,784,261 A | 7/1998 | Pedder | |
| 5,946,553 A * | 8/1999 | Wood et al. | 438/108 |
| 6,175,158 B1 | 1/2001 | Degani et al. | |
| 6,208,025 B1 | 3/2001 | Bellaar et al. | |
| 6,274,929 B1 | 8/2001 | Leong et al. | |
| 6,319,829 B1 * | 11/2001 | Pasco et al. | 438/678 |
| 6,332,782 B1 | 12/2001 | Bezama et al. | |
| 2003/0067755 A1 | 4/2003 | Haimerl et al. | |
| 2004/0212972 A1 * | 10/2004 | Khilchenko et al. | 361/790 |

* cited by examiner

*Primary Examiner*—Michelle Estrada
*Assistant Examiner*—Jarrett J. Stark
(74) *Attorney, Agent, or Firm*—Edell, Shapiro & Finnan, LLC

(57) ABSTRACT

An electronic component has a semiconductor chip and microscopically small flip-chip contacts belonging to a rewiring plate, on which macroscopically large elastic external contacts are arranged. The rewiring plate has a wiring support made of polycrystalline silicon, amorphous glass, or metal. Furthermore, the present invention relates to a method for the production of a suitable wiring support and of the electronic component.

5 Claims, 13 Drawing Sheets

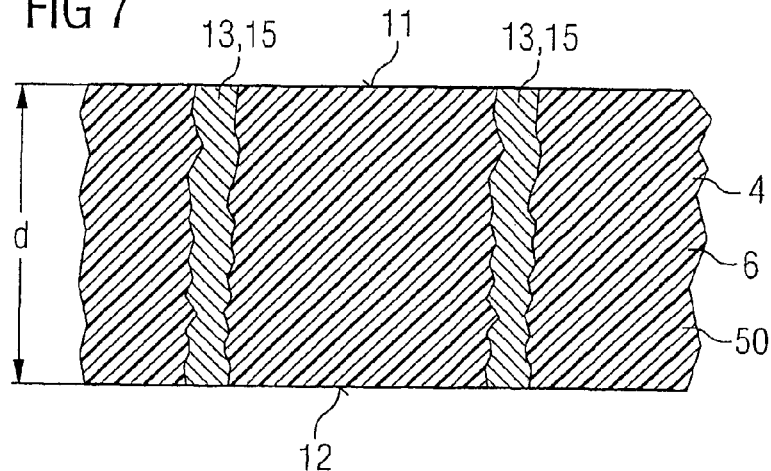
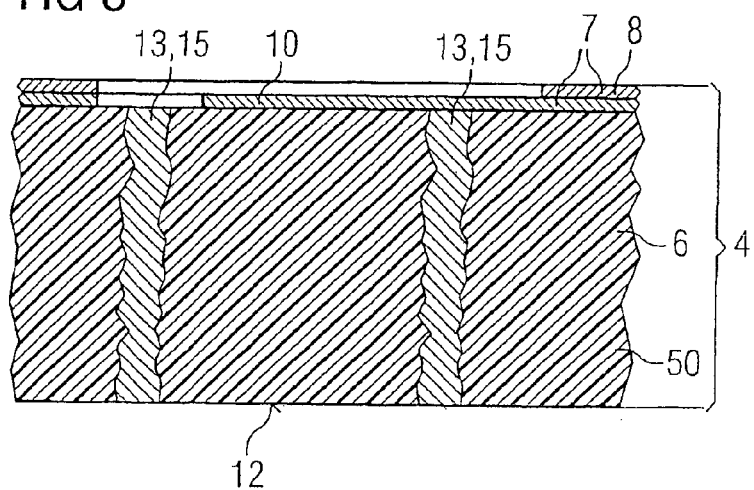
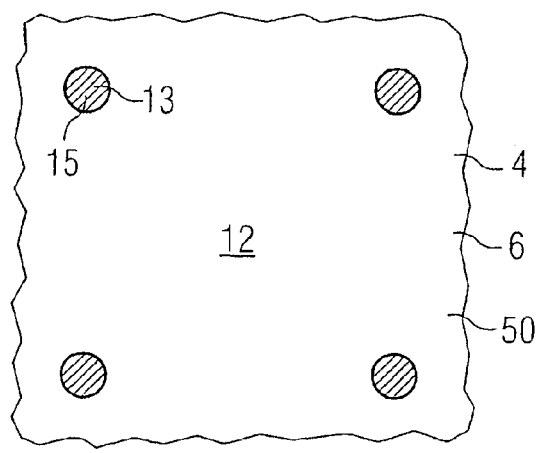

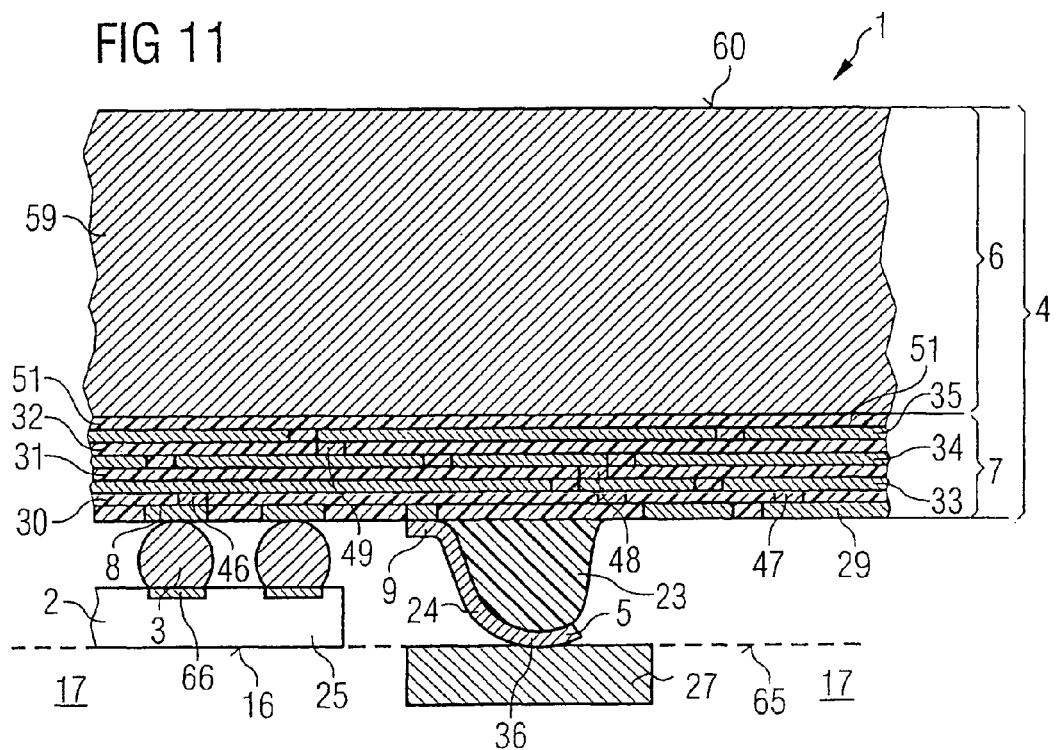
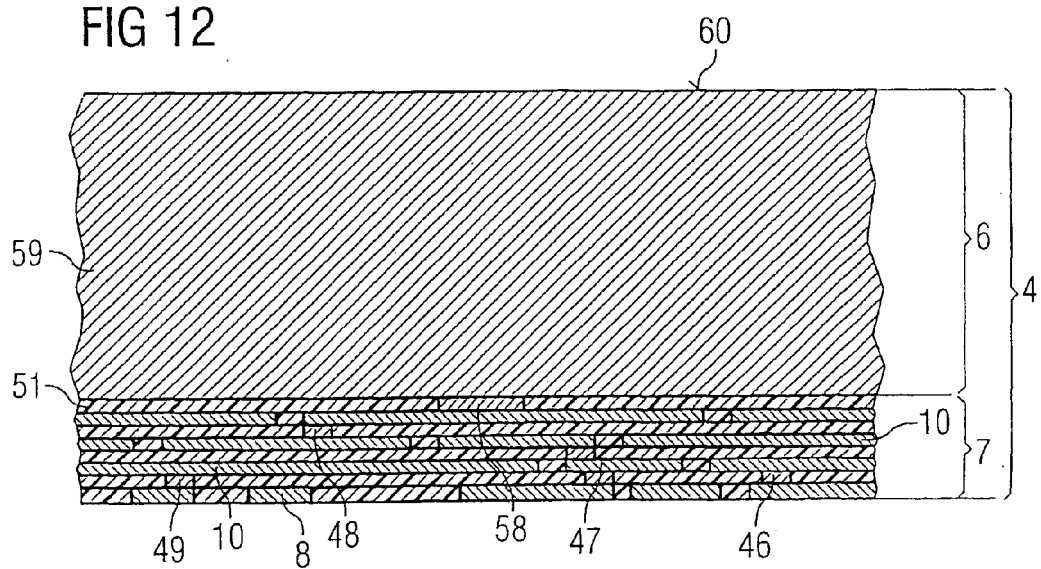

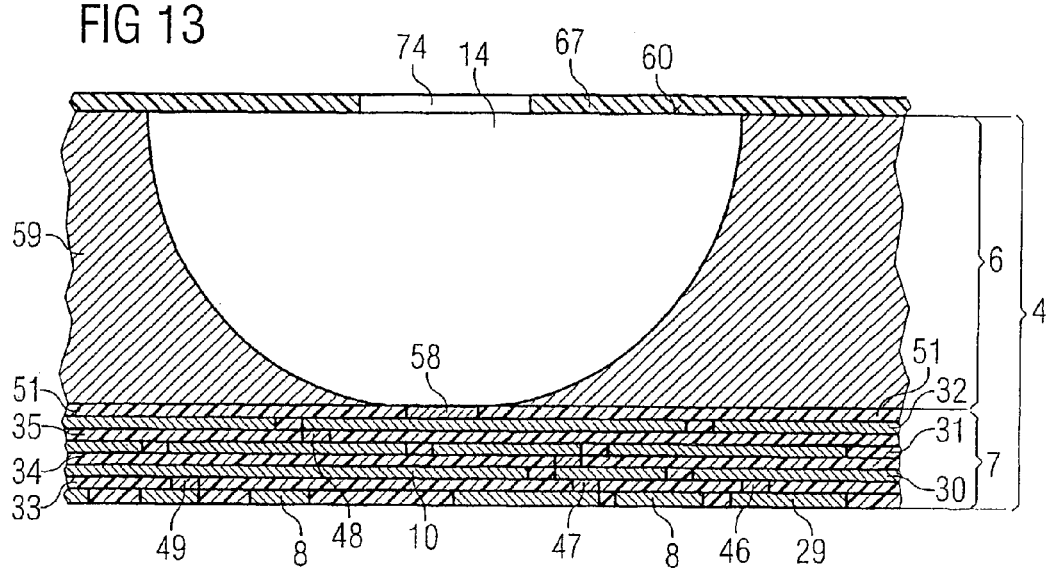
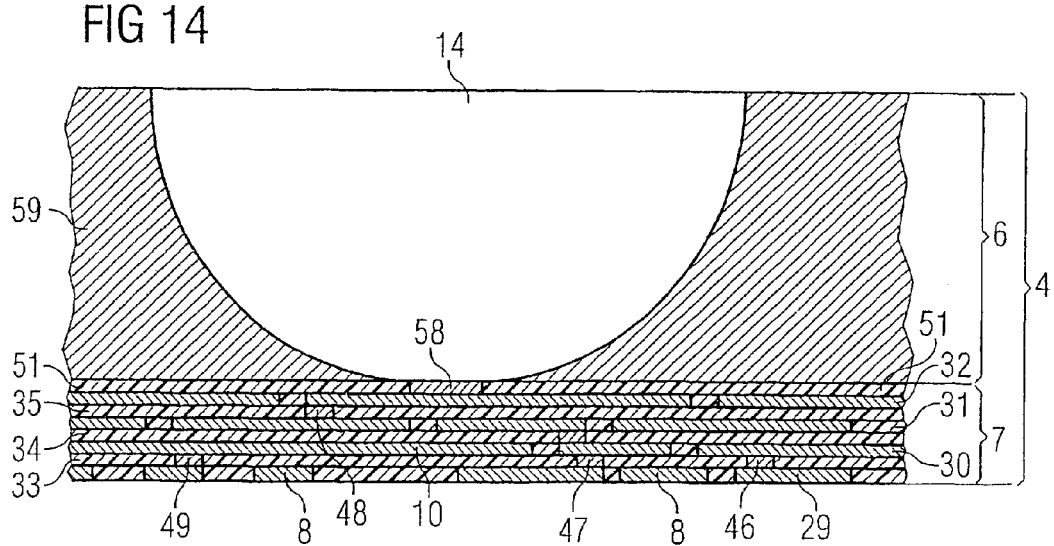

ELECTRONIC COMPONENT HAVING AT LEAST ONE SEMICONDUCTOR CHIP AND FLIP-CHIP CONTACTS, AND METHOD FOR PRODUCING THE SAME

CROSS REFERENCE TO RELATED APPLICATIONS

This application is a continuation of PCT/DE03/01150, filed Apr. 8, 2003, and titled "Electronic Component Having at Least One Semiconductor Chip and Flip-Chip Contacts, and Method for the Production Thereof," which claims priority to German Application No. DE 102 15 654.9, filed on Apr. 9, 2002, and titled "Electronic Component Having at Least One Semiconductor Chip and Flip-Chip Contacts, and Method for the Production Thereof". The disclosures of the above patent applications are incorporated herein by reference in their entireties.

FIELD OF THE INVENTION

The invention relates to an electronic component having at least one semiconductor chip and flip-chip contacts, and a method for producing the same.

BACKGROUND

With an increasing number of external contacts, it becomes more and more difficult to reserve a sufficiently large and stable area on which the external contacts of a semiconductor chip can be arranged. In this case, the external contacts differ from the flip-chip contacts in terms of their order of magnitude. Flip-chip contacts, which are arranged immediately on contact areas of a semiconductor chip, have microscopically small dimensions, i.e., the flip-chip contacts can be measured only under an optical microscope. In this connection, flip-chip contacts are understood to mean both microscopically small solder balls or contact bumps of about 150 to 250 µm in external diameter, and also microscopically small surface contacts, i.e., "solid" contacts, which, with external dimensions of about 15 to 25 µm, are an order of magnitude smaller than solder balls or contact bumps using flip-chip technology. On the other hand, external contacts have macroscopically large dimensions, which are visible and measurable with the naked eye and have dimensions in the range from 0.5 to 2 mm.

Consequently, if the number of external contacts increases, then the external dimensions of the electronic components become larger and can far exceed the size of the semiconductor chip, which bears the flip-chip contacts. At the same time, as the chip becomes larger, so do the problems of thermal equalization between the microscopically small contacts of the semiconductor chip and a rewiring plate made of circuit board material, such as glass fiber-reinforced plastic, which can accommodate the large number of external contacts and is permanently connected to the semiconductor chip via the flip-chip contacts.

Since the thermal expansion coefficient of the semiconductor chip, in particular, of silicon, is about 4 ppm/°K and a circuit board material with glass fiber reinforcement, which bears the macroscopically large external contacts, has an expansion coefficient between 13 and 16 ppm/°K, in particular, the microscopically small flip-chip contacts of a silicon semiconductor chip, which are arranged at the outer edges of the semiconductor chip, are stressed. This stress leads to breaks. As a result, the entire component becomes unserviceable.

A further problem results from the fact that the macroscopically large external contacts of the component, which can consist of solder balls or solder bumps and are to be soldered to a circuit board of a primary circuit arrangement, represent a relatively rigid connection to the primary circuit arrangement. The external contacts can also break with respect to the primary circuit under thermal stress.

In large-area semiconductor chips with a high flip-chip contact density and large-area rewiring plates for electronic components having a high external contact density, an electronic component which can be connected with higher reliability to a primary circuit arrangement with a reduction in the shear stress of the external contact areas and external contacts, and the shear stress of the microscopically small flip-chip contacts is desirable.

SUMMARY

An electronic component having at least one semiconductor chip which has macroscopically small flip-chip contacts can be connected to a rewiring plate on which macroscopically large elastic external contacts are arranged. The rewiring plate has a wiring support with a rewiring pattern, which connects the microscopically small contact connecting areas to the macroscopically large external contact areas via conductor tracks. The wiring support includes a polycrystalline silicon, an amorphous glass, or a metal. These materials are matched to the material of the semiconductor chip in terms of their thermal expansion behavior.

The matched thermal expansion behavior can be achieved by the thermal expansion coefficient of the wiring support being equal to or greater than the thermal expansion coefficient of the semiconductor chip. The thermal expansion coefficient of the wiring support may not exceed 1.5 times the thermal expansion coefficient of the semiconductor chip. With this matching, after the flip-chip contacts have been soldered to the contact connecting areas on the wiring support, the semiconductor chip is stressed only in compression.

With such an electronic component, the microscopically small flip-chip contacts of the semiconductor chip are loaded thermomechanically to a minimal extent, since polycrystalline silicon, amorphous glass, or metal is used as the wiring support, which has approximately the same or at most a 50% higher expansion coefficient than a monocrystalline semiconductor chip material. Since macroscopically large elastic external contacts project out of the electronic component, these elastic external contacts can be connected to a primary circuit arrangement without the electronic component being stressed thermomechanically by these connections. Instead, a considerable proportion of the shear stress is absorbed by the elastic external contacts when the electronic component having the macroscopically large elastic external contacts is arranged on a primary circuit arrangement made of a circuit board material. The rest of the shear stress is absorbed by the wiring support and does not stress the semiconductor chip. With these two measures, i.e., the use of a wiring support made of silicon, glass, or metal as a carrier of the rewiring pattern and elastic external contacts on the rewiring plate, the risk of contact breakages both within the electronic component at the flip-chip contacts and outside the electronic component at the macroscopically large elastic external contacts is reduced.

Also, the materials for the wiring plate can be polished relatively precisely as semiconductor wafers. This permits the use of thin-film techniques for the production of the rewiring plate, as are used for the production of semiconductor chips. Precision of this kind cannot be achieved with rewiring plates on circuit board materials.

The rewiring plate can be tested for its function as an intermediate product and independent component before the electronic component is completed by fitting of the semiconductor chip with its flip-chip contacts.

In a further embodiment of the invention, the flip-chip contacts provided are microscopically small surface contacts or solid contacts, which include intermetallic phases. Surface contacts of this type can be implemented at least one order of magnitude smaller than microscopically small solder ball contacts and permit a correspondingly higher flip-chip contact density on the semiconductor chip.

The semiconductor chip with its flip-chip contacts can either be arranged on the upper side of the rewiring plate made of silicon, amorphous glass, or metal with matched thermal expansion coefficient, which bears the macroscopically large elastic external contacts, or on the opposite side of the rewiring plate, which bears a multilayer rewiring pattern, and, in the case of stacking electronic components, can also have macroscopically large external contact areas.

In the case in which the semiconductor chip with its flip-chip contacts and the macroscopically large external contacts are arranged on the same side of the rewiring plate, one rewiring pattern is provided in order to connect the microscopically small flip-chip contacts to the macroscopically large elastic external contacts.

If a nonmetallic wiring support plate is used as the wiring support, then the rewiring pattern can be arranged directly on the polished upper side of the nonmetallic wiring support plate. In the case of a metallic wiring support plate, an insulating layer is provided between the rewiring pattern and the polished upper side of the metallic wiring support plate.

If, in a further embodiment of the invention, the microscopically small flip-chip contacts are arranged on an area of the rewiring plate opposite the macroscopically large elastic external contacts, then the wiring support made of polycrystalline silicon, amorphous glass, or metal has through contacts, which connect the conductive components of the two sides to one another, i.e., the rewiring pattern on the side of the semiconductor chip is connected electrically via the through contacts to external contacts arranged in a corresponding fashion in a matrix with a fixed grid dimension on the opposite side of the wiring support.

If the wiring support includes polycrystalline silicon, then the wiring support can have an insulating layer between through contact and polycrystalline silicon. If the wiring support includes metal, then the wiring support has an insulating layer between through contact and metal.

The material of the through contacts is matched to the thermal expansion behavior of the wiring support. The wiring support comprising metal can comprise an iron/nickel alloy with a nickel proportion of 40 to 42% by weight or can be produced from a copper/molybdenum alloy with 10 to 30% by weight of copper. The latter alloy can be implemented as a powder-metallurgical infiltration material. Both metal alloys have thermal expansion behavior that can be adjusted by the mixture ratio of the alloy components and can thus be matched to the thermal expansion behavior of the semiconductor chip material.

The rewiring plate makes it possible to accommodate several hundred macroscopically large elastic external contacts on the rewiring plate, particularly when the semiconductor chip has a correspondingly large number of flip-chip contacts. In such cases, a multilayer rewiring pattern can be used.

The through contacts in the wiring support can have laser drilled, metallized passage holes. Furthermore, the wiring support can have water-jet drilled, metallized passage holes as through contacts. Since the external contacts arranged in the region of the through contacts are macroscopically large, methods of this type, such as laser drilling or water-jet drilling, can be used to provide the wiring support made of silicon, amorphous glass, or metal with such macroscopically large passage holes. Furthermore, dry etching methods, such as reactive plasma etching and wet etching methods, can be used in order to implement suitable passage holes.

In a further embodiment, the insulating plate can have metallic wires in glass or polycrystalline silicon as through contacts, which are arranged in a grid dimension, which corresponds to the grid dimension of the external contacts. With such an insulating plate, the through contacts can have a relatively smaller diameter than the through contacts, which are produced via passage holes. Thus, in the case of such an insulating plate which has metallic wires as through contacts, the grid dimension for the arrangement of the external contacts can be minimized. For this purpose, the metallic wires, which are embedded in the nonmetallic insulating plate made of amorphous glass or of polycrystalline silicon, can be produced as through contacts from metallic glass fusing materials, such as chrome-vanadium steel or chrome-molybdenum steel or chrome-nickel steel.

Inherent stresses in the glass-metal composite can be minimized. Furthermore, relatively more efficient wiring can result due to the small diameter of embedded leadthrough wires as through contacts and smaller contact spots in the wiring planes of the rewiring plate.

A further possibility is to embed carbon fibers or graphite fibers in glass or in polycrystalline silicon as through contacts, which are likewise arranged in a grid dimension, which corresponds to the grid dimension of the external contacts. Compared to metal wires, carbon fibers or graphite fibers can be meshed relatively more intensely with this insulating material without any surface treatment, when embedded in glass or polycrystalline silicon.

Furthermore, at least one semiconductor chip can be arranged in the center of the electronic component and can be surrounded by the elastic external contacts. In this case, the semiconductor chip can have a solder layer at its rear, which permits central fixing of the electronic component on a primary circuit board and limits the pressure on the elastic external contacts. Construction of this type assumes that the semiconductor chip is arranged on the wiring support on the same side as the macroscopically large elastic external contacts, the multilayer rewiring pattern ensuring that the microscopically small flip-chip contacts of the semiconductor chip are connected to the macroscopically large external contact areas, which are provided for the elastic external contacts.

For the case in which the semiconductor chip and the external contacts are arranged on opposite sides, a limited number of rigid external contacts can be provided in the center of the electronic component, which permit central fixing of the electronic component on a primary circuit board circuit and which limit the pressure on the elastic external contacts. These rigid and nonelastic external contacts located at the center can include solder balls or solder bumps, and, by a predetermined height, can define stabilization of the positioning of the electronic component on a primary circuit arrangement of a circuit board.

In this case, as mentioned above, the rewiring pattern on the side of the semiconductor chip can connect to the external contacts on the opposite side of the rewiring plate via through contacts. A method for the production of an insulating plate with embedded wires as through contacts for a plurality of electronic components can include introducing a matrix of wires in a grid dimension provided in an elongated, pillar-like mold; potting the wires in the mold with a melt of glass or highly pure silicon; and dividing the solidified potting compound into disks transversely with respect to the longitudinal extent of the wires to form wiring supports having through contacts.

Relatively fine and precise through contacts can be made available in the insulating plate, so that a higher through contact density is possible and microscopically small contact areas for rewiring can be implemented on the ends of the through contacts.

In a further method for the production of a wiring support from amorphous glass, short wires are embedded in a plate glass melt. In this case, short wires are introduced continuously row by row into a molten plate glass bed, while guiding along crossmembers which are fitted with short wires and from which the short wires project, the short wires projecting through the plate glass melt. After the plate glass melt has solidified in the plate glass bed, the crossmembers are removed from the embedded short wires in the plate glass production line and fed back to be fit with short wires again. After that, the ends of the short wires projecting from the plate glass on both sides can be etched away in order to create through contacts. Finally, the plate glass provided with through contacts can be separated to form wiring supports.

In order to secure the fixing of the wires within the wiring support, the wires can have roughening on the outer surface, so that a form-fitting connection is made between the amorphous glass compound or the polycrystalline silicon compound and the wires. Instead of metallic wires, carbon fibers and/or graphite fibers can also be embedded in the polycrystalline silicon compound or the amorphous glass compound as through contacts. These fibers have natural roughness on their upper side, so that roughening the surface of the fibers can be omitted.

Another method for the production of a wiring support with through contacts includes producing passage holes in the wiring support and metallizing these passage holes. For this purpose, a wiring support plate made of amorphous glass or of polycrystalline silicon in the final thickness between 50 and 500 micrometers is provided. A matrix of passage holes is then introduced in a predefined grid dimension. After that, by powder coating or sputtering, a first metal layer can be applied as a seeding layer onto the insulating plate with passage holes. Finally, the seeding layer can be followed by electrodeposition of a second metal layer in order to fill the passage holes to form through contacts.

The introduction of the passage holes in polycrystalline silicon plates, amorphous glass plates or metal plates can be carried out by laser drilling or by water-jet drilling. While water-jet drilling produces no thermal stresses in the material, in the case of laser drilling the material must be evaporated in order that passage holes are produced, which can lead to thermal stresses. In the case of water-jet drilling, however, the wiring support plate must withstand high mechanical pressures. Both methods have already been shown to be promising methods both during the testwise drilling of polycrystalline silicon plates and during the drilling of amorphous glass plates as well as the drilling of metal plates.

Further methods of introducing passage holes are a wet etching technique or a reactive plasma etching method. By using these methods, extremely precise passage holes can be drilled, since regions that are not to be etched can be covered by photolithographic methods and extremely narrow submicrometer structures can be implemented.

A method for the production of a rewiring plate from metals with through contacts for a plurality of electronic components can include applying a rewiring pattern to a metal plate as wiring support with a structured insulating layer between the wiring support and rewiring pattern, the structured insulating layer having through contacts to the metal plate at point at which through contacts through the wiring support are provided; introducing passage holes as far as the through contacts in the insulating layer from the side opposite the rewiring pattern; applying a further structured insulating layer to the side of the metal plate opposite the rewiring pattern while leaving free the through contacts in the structured insulating layer of the rewiring pattern; applying elastic bodies for elastic external contacts; and applying a structured metal layer to form through contact lines in the through contact holes and line paths and external contacts on the elastic bodies.

Relatively precise structures can be formed on both sides of a surface-polished metal plate. Furthermore, due to the high strength, the metal plate supplies a stable support for the electronic component. Moreover, based on the choice of the metal plate alloy, the wiring support produced in the process and the rewiring plate can be matched relatively more precisely than glass plates to the semiconductor chip in terms of thermal expansion behavior.

If a wiring support of this type or a rewiring plate having through contacts is already available, then further steps are needed in order to produce an electronic component. First, a rewiring pattern made of a metal alloy is applied to a wiring support provided with through contacts, if this has not yet been done, the rewiring pattern having microscopically small contact connecting areas and macroscopically large external contact areas and conductor tracks between them. This rewiring pattern must be implemented in many layers in order to connect the large number of flip-chip contacts of the semiconductor chip to appropriate external contact areas. Then, on the opposite side, if not already present on the rewiring plate, elastic external contacts can be connected to the external contact areas via the through contacts. Finally, the flip-chip contacts of a semiconductor chip are applied to the rewiring pattern by connecting the microscopically small flip-chip contacts to the microscopically small contact connecting areas. The order of the processing can be interchanged, in particular, the semiconductor chips can also be applied before the application of the external contacts.

In the case of a wiring support which has no through contacts is available, both the semiconductor chip and the elastic external contacts are applied to the same upper side of the rewiring plate made of polycrystalline silicon, amorphous glass, or metal. For the production of such a component, a multilayer rewiring pattern electrically insulated from the wiring support is applied to the wiring support. The pattern has conductor tracks, contact connecting areas for the flip-chip contacts of the semiconductor chip, and external contact areas for the elastic macroscopically large external contracts. In this case, the macroscopically large external contacts are arranged around the semiconductor chip in a plurality of external contact rows.

By the height of the semiconductor chip, the height or the spacing from its primary circuit arrangement can be fixed vertically. In addition, the centrally arranged semiconductor chip can ensure that the center of the electronic component is also fixed laterally with respect to a primary circuit arrangement. For this purpose, the rear of the semiconductor chip is provided with an appropriate solder layer or with an adhesive layer, with which the semiconductor chip, and therefore, the center of the electronic component is then soldered or adhesively bonded to the primary circuit board.

In summary, it should be recorded that implementation of electronic components as pure Si/glass BGA arrangements (BGA=ball grid arrays) is not possible, since the different expansion coefficients of SI/glass BGA arrangements and a circuit board on which the component with its external contacts is to be mounted is too great. In the case of larger BGAs of more than 10 mm edge width, the external solder balls are primarily broken off at low temperatures. It is therefore generally not possible to apply such a construction of an electronic component directly to a circuit board of this type.

With the present invention, the elastic electric contacts of a housing technology based on a system substrate basis are combined with the rewiring plate concept of the BGA technology. With the aid of this rewiring plate, the action of breaking down the external contact areas located on a "motherboard" or a circuit board is implemented by an interposed rewiring plate or an "interposer". The interposer is produced in wafer form from a semiconductor material, for example, undoped silicon, or by a nonconductor, for example, of amorphous glass, or by a conductor, for example, metal. The thermal expansion coefficient of the wiring support material of the rewiring plate is matched to the thermal expansion coefficient of the material of the semiconductor chip.

As a result of incorporating a rewiring plate made of a polycrystalline silicon plate, an amorphous glass plate or a metal plate as a wiring support with multilayer rewiring pattern in an electronic component, the following results may be possible.

1. By mechanically compensating elastic external contacts applied individually or by surface processes, the forces in the case of thermomechanical stress are reduced and the reliability of the electronic component is increased. The mechanical compensation of the elastic contacts can in this case be carried out in different ways. In principle, any elastically conductive structure can be used for the invention.

2. By flip-chip mounting of the semiconductor chip on a structured thin film as a rewiring pattern on the polished surface of a wiring support, high input-output densities, i.e., a high flip-chip contact density, can be produced.

3. Given simple wiring structures of the rewiring plate, the wiring process can be supplied as early as during the production of the contacts, by the elastic external contacts being wired appropriately, so that the costs for the additional thin film process for producing conductor tracks can be saved. At least, this thin film process for the production of conductor tracks can be simplified by one metal layer. Likewise, such a process of elastic external contacts also replaces the otherwise usual metallization between solder ball and chip or solder ball and wiring support.

4. The construction according to the invention exhibits a considerably improved dissipation of heat as a result of low thermal transfer resistances from the integrated semiconductor chip via the solder balls or flip-chip contacts directly into the carrier silicon material of the insulating plate, which exhibits very good thermal conductivities of about 100 W/m.K at 125 K. The rewiring plate can be made of silicon to be cooled directly by air, particularly, since the elastic external contacts have a spacing, not filled up by "underfill", from a primary circuit arrangement based on a circuit board. Even glass at about 1 W/m.K has sufficient thermal conductivities, but can be improved by a correspondingly high large number of through contacts, for example, having a contact-making diameter of 400 micrometers and a grid dimension of 1 mm and made of copper, which exhibits 200 W/m.K as thermal conductivity value. A wiring support made of glass with a corresponding number of through contacts made of copper can, for example, achieve a thermal conductivity in the Z direction of about 50 w/m.K.

5. In the case of glass supports with through contacting, because of the associated anisotropic thermal conductivity, specifically only 1 W/m.K in the X and Y directions and about 50 W/m.K in the Z direction, semiconductor chips with a high heat output can be arranged beside temperature-sensitive semiconductor chips on the same rewiring plate, without the properties of the semiconductor chips being affected.

6. In addition, a higher electric performance results from directly leading the electric, freely scalable, short lines in air with a shielding plane arranged close to them. Therefore, the construction according to the invention can specifically also be used for high frequency applications, but, in particular, also in a mix of digital applications with a high wiring density.

7. The rewiring plate can be implemented as a thin film support in standard wafer format, for example, of 200 mm or 300 mm diameter, with polished surfaces. Thus, process steps for microscopically small structures, which are already successful in wafer technology, can be used for the production of the rewiring plates.

8. The conductive external contacts in this invention supply the thermomechanical compensation, so that it is possible to dispense with an "underfill", so that in the event of malfunctions, the electronic component of this invention can be unsoldered again and therefore repairs are permissible.

9. The wiring density of the multilayer rewiring structure gives rise to low costs because of the thin film technology which can be used, and the continuous wafer processing of the rewiring plate results in considerably lower costs per external connection than in the case of BGA technology, in particular, in the case of a high external contact number (or a "high pin count").

10. Because of the substantially similar expansion coefficients of the semiconductor chip and the rewiring plate according to the invention, at least when polycrystalline silicon is used for the rewiring plate, the mechanical stress in the event of temperature changes and, in particular, at low temperatures is substantially lower than in the case of housing technologies, which are based on rewiring plates or plastic films. As mentioned above, it is possible to dispense with the underfill between silicon rewiring plate and semiconductor chip. However, care is taken that the soldering temperature of the inner contacts is sufficiently higher than the temperature of the external soldering contacts, in order that the connection between semiconductor chip and rewiring plate is not loosened when the component according to the invention is soldered in.

11. As a result of the extremely wide omission of organic materials which, as a result of water absorption, exhibit a "popcorn effect" in the event of subsequent sudden heating, which can lead to destruction of the housing, a higher moisture classification of the electronic component of the present invention is also achieved here by the lack of "underfill".

12. By a stopper applied separately or applied to the rear of the semiconductor chip, overloading as a result of pressure is prevented for the elastic external contacts.

13. As a result of soldering the stopper in or adhesively bonding the stopper on, not only is the rear of the chip grounded, but, as a result, other forces, which act on the elastic external contacts, are also absorbed, so that mechanical overloading of the elastic external contacts as a result of pulling or shearing does not occur.

14. If, as provided in one embodiment of the invention, the through contacts are implemented with alternately elastic contacts and with rigid soldered contacts, in particular, in a small region in the center, then a stopper can be supplied by these rigid solder contacts, and mechanical stabilization in the event of tensile and shearing forces can be achieved.

15. If the elastic contacts are combined with rigid soldered contacts, such as electroplated solder balls, then an electrical connection for high frequencies in higher gigahertz ranges is possible.

16. Since the materials used in the present invention are temperature-stable to far above 200° C., the result is an electronic component having a housing, which is suitable for high temperature environments.

BRIEF DESCRIPTION OF THE FIGURES

The invention will now be explained in more detail using exemplary embodiments with reference to the appended figures, in which:

FIG. 7 shows a schematic cross section of a wiring support having embedded wires as through contacts, FIG. 8 shows a schematic cross section of a wiring support having embedded wires and a multilayer rewiring pattern applied to one side, FIG. 9 shows a schematic bottom view of a wiring support having embedded wires, FIG. 11 shows a schematic cross section through an electronic component having a metal wiring support, FIGS. 12 to 17 show schematic results of method steps for the production of a rewiring plate having through contacts through a metal wiring support, where FIG. 12 shows a schematic cross section of the rewiring plate with rewiring pattern on a metal plate, FIG. 13 shows a schematic cross section of the rewiring plate with an etching mask and an etched passage hole for making a through contact, FIG. 14 shows a schematic cross section of the rewiring plate of FIG. 12 following removal of the etching mask, FIG. 15 shows a schematic cross section of the rewiring plate following the application of a structured insulating layer, FIG. 16 shows a schematic cross section of the rewiring plate following the application of an elastic body for an external contact, and FIG. 17 shows a schematic cross section of the rewiring plate following the application of a structured metal layer for forming elastic external contacts.

DETAILED DESCRIPTON

Figure 1:
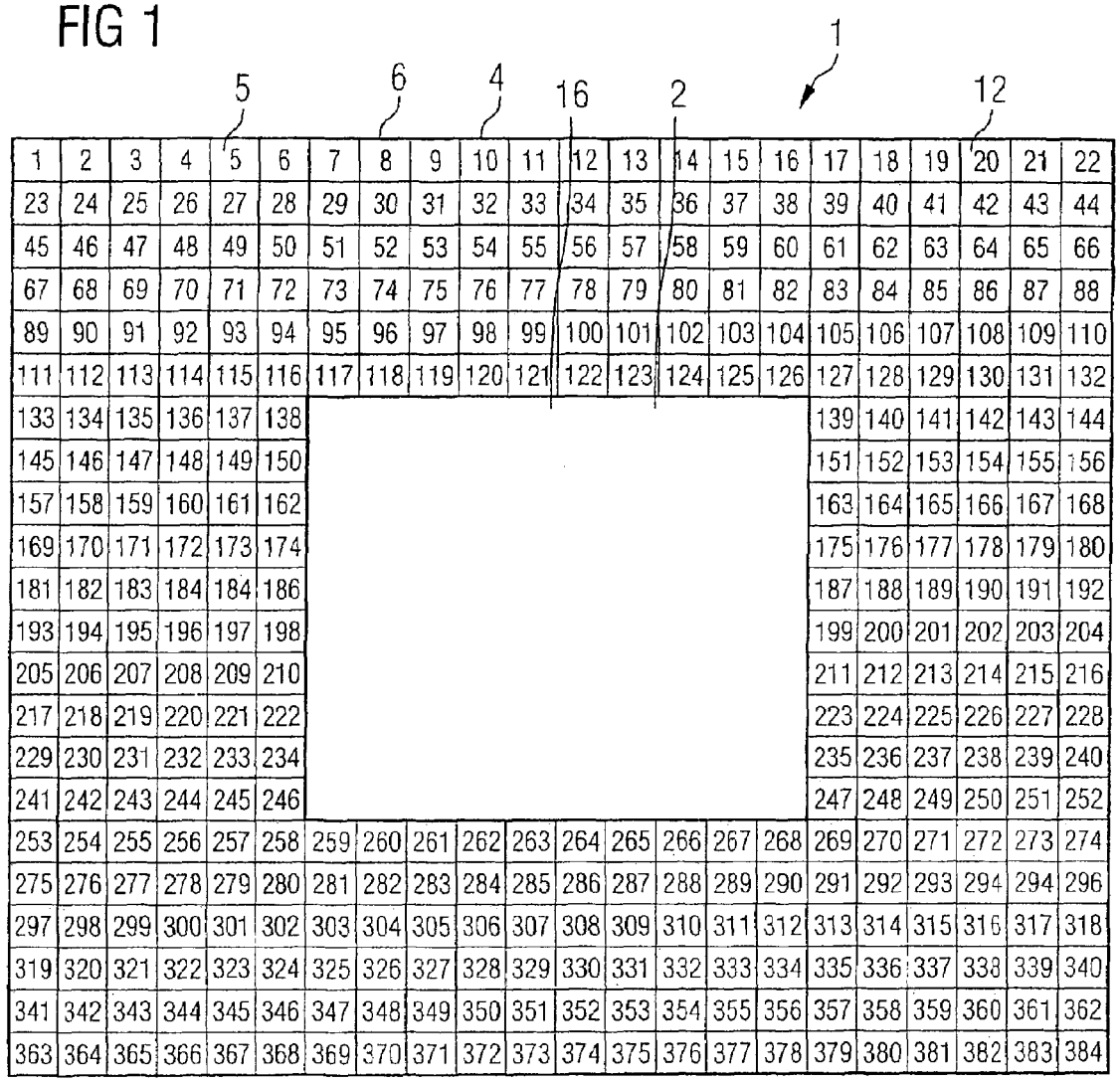
FIG. 1 shows a schematic plan view of the external contact side of an electronic component of a first embodiment of the invention.

FIG. 1 shows a schematic plan view of the external contact side of an electronic component 1 of a first embodiment of the invention. The designation 2 identifies a semiconductor chip which, in flip-chip technology, is arranged with its microscopically small flip-chip contacts on the wiring support 6. Only the passive rear of the electronic semiconductor chip 2 is visible in this plan view of the external contact side. The semiconductor chip 2 is surrounded by a number of external contacts (e.g., the small numbers 1–384 showing the number and arrangement of the macroscopic external contacts on the schematic plan view of the electronic component in FIG. 1).

The external contacts 5 bearing the position designations 1 to 384 are arranged in rows and columns in a predefined grid dimension. The macroscopically large elastic external contacts 5 are connected electrically to the microscopically small flip-chip contacts of the semiconductor chip 2 via a possibly multilayer rewiring pattern. The rear of the semiconductor chip 16 is square in this embodiment of the invention. In this embodiment of the invention, the substantially larger rewiring plate 4 is also square and has a wiring support 6 with applied multilayer rewiring pattern. The rewiring plate can also be designed as a rectangle or polygonally in addition to square forms. Thus, hexagonal, octagonal and many other forms of the rewiring plate can be produced. Because of the macroscopic size of the elastic external contacts 5, i.e., a size, which can be detected by the naked eye, these external contacts 5 can no longer be arranged directly on the semiconductor chip 2. On the semiconductor chip 2, on the active side (not shown), there are arranged only microscopically small flip-chip contacts, whose dimensions are small such that they can be measured only with the aid of an optical microscope.

The rewiring plate 4 depicted here has a wiring support 6 which is composed substantially of a polycrystalline silicon, but can also be produced from metal or amorphous glass. Polycrystalline silicon can be processed to form thin wafers with polished surfaces and can be matched to the normal wafer dimensions, for example, of 200 mm or 300 mm diameter, so the application of the multilayer rewiring pattern can be carried out repeatedly and successively with a known photoresist technique.

Figure 2:
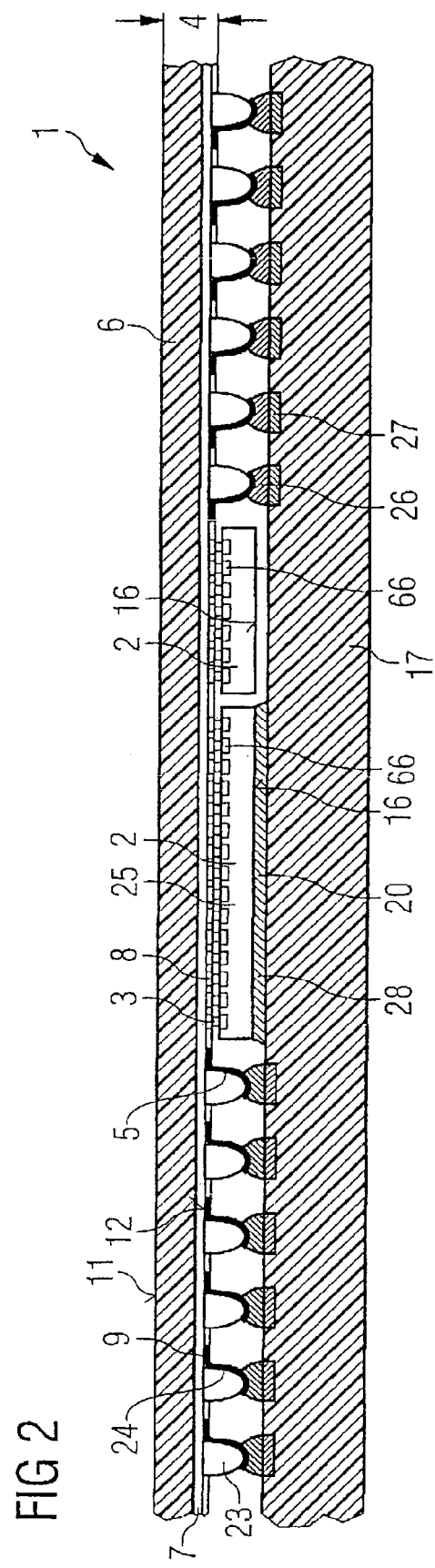
FIG. 2 shows a schematic cross section through an electronic component of a further embodiment of the invention.

FIG. 2 shows a schematic cross section through an electronic component 1 of a further embodiment of the invention. Components having the same functions as in FIG. 1 are identified by the same designations and not specifically explained.

The embodiment of the invention according to FIG. 2 differs from the embodiment according to FIG. 1 in that two semiconductor chips 2 are arranged on the rewiring plate 4. The rewiring plate 4 is composed substantially of a wiring support 6 of silicon, glass or metal. The thermal expansion coefficient of the wiring support material is matched to the thermal expansion coefficient of the semiconductor chip 2, and the wiring support 6 is coated on one side with a multilayer rewiring pattern 7. This rewiring pattern 7 connects the microscopically small flip-chip contacts 3 of the semiconductor chip 2 to the macroscopically large elastic external contacts 5 on the rewiring plate 4. The elastic external contacts 5 in this embodiment of the invention have an elastic body 23 of resilient material, which is coated with a conductor path 24. This conductor path 24 is applied at the same time as the topmost structured metal layer of the multilayer rewiring pattern 7.

In the multilayer rewiring pattern 7, insulating layers are arranged between the individual metallic layers and, in addition, through contacts through the insulating layers are provided. Thus, within the multilayer rewiring pattern 7, cable links can be created in order to connect the elastic macroscopic external contacts 5 with their external contact areas 9 electrically via the rewiring layers of the rewiring pattern 7 to the microscopically small flip-chip contacts 3 of the semiconductor chip 2. The size of the rewiring plate 4 can be widened as desired to producte dimensions of semiconductor wafers having diameters of 200 to 300 mm, so that this cross section of FIG. 2 should be viewed merely as a detail from an electronic component 1. Due to the material selection of the wiring support 6, there is relatively complete agreement between the thermal expansion behavior of the material of the wiring support 6 and the material of the semiconductor chip 2, which has a monocrystalline silicon.

In FIG. 2, in addition to the electronic component 1, a circuit board 17 is illustrated schematically in cross section. This circuit board 17 belongs to a primary circuit arrangement having a plurality of other electronic components as desired. The circuit board 17 is made of glass fiber-reinforced plastic, which has a thermal expansion coefficient, which is higher, for example, by the factor 3–5 than the thermal expansion coefficient of the wiring support 6 made of polycrystalline silicon, amorphous glass, or metal. Nevertheless, no breaks occur in the soldered connection 26 between contact connecting areas 27 on the upper side of the circuit board 17 and the external contacts 5, since these external contacts 5 have a resilient body 23. Thus, thermomechanical stresses can be absorbed without breakage of contacts.

In this embodiment of the invention, furthermore, a stopper region 28 is implemented by the semiconductor chip 25, since the external contact 5 can be pressed back only as far as the height of the stopper region 28. Additional mechanical fixing may be achieved by soldering or adhesively bonding the passive rear 16 of the semiconductor chip 25 to the circuit board 17 with an adhesive, which has a glass transition temperature of about 200° C. By the stopper region 28, the electronic component 1 is fixed to the circuit board 17, and then, the pressure on the elastic external contacts 5 is limited.

FIG. 2 shows, furthermore, that in the present embodiment of the invention it is possible to dispense with an "underfill," which otherwise absorbs the shear strain on account of thermomechanical stress. By dispensing with an "underfill" in this embodiment of the invention, the electronic component 1 can be released from the primary circuit arrangement in the event of malfunction and can be replaced by a serviceable electronic component 1. Thus, repairs are possible.

Figure 3:
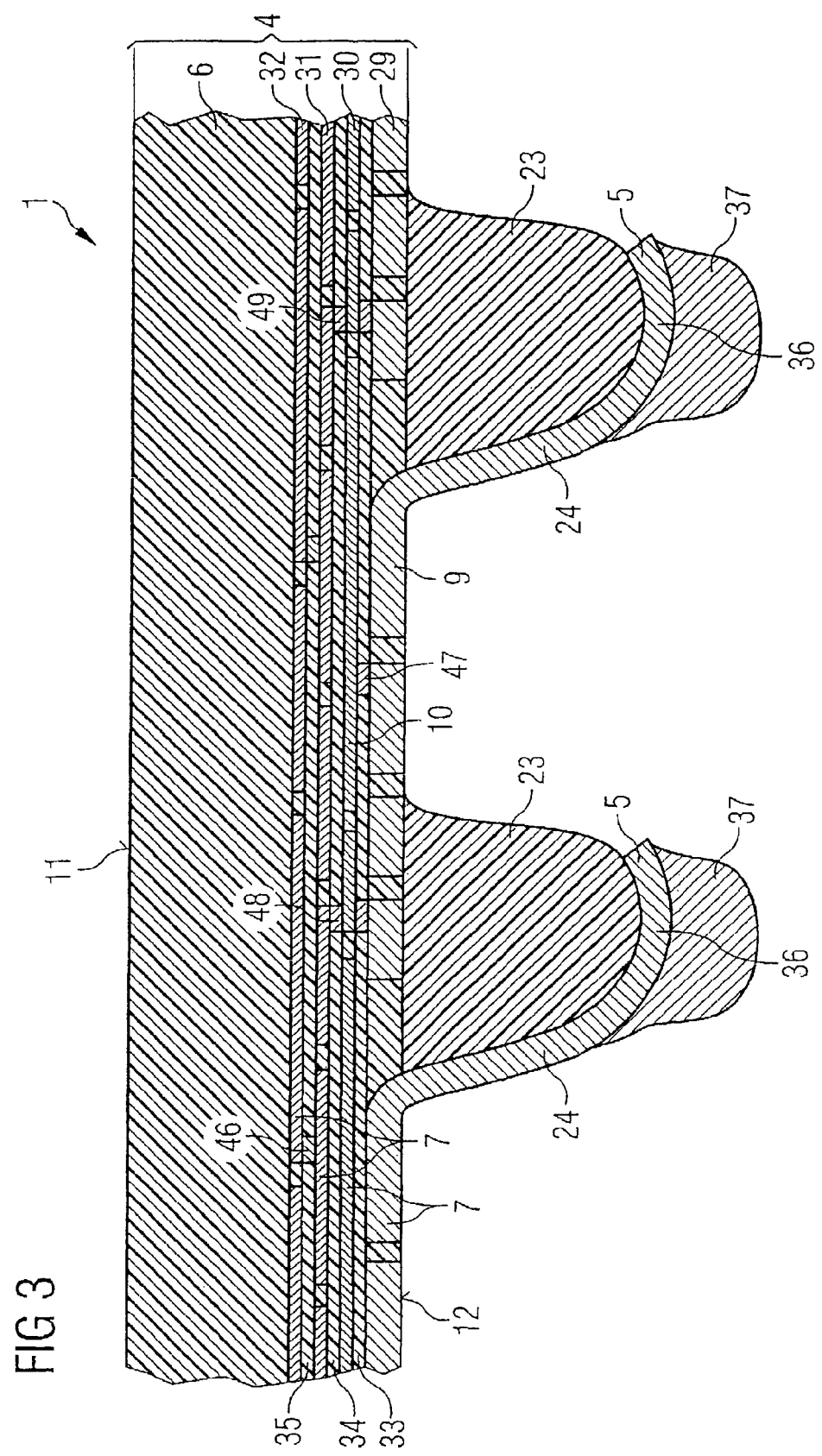
FIG. 3 shows a schematic cross section through a section of an electronic component of the first embodiment of the invention.

FIG. 3 shows a schematic cross section through a section of an electronic component 1 of the first embodiment of the invention. Components having the same functions as in the preceding figures are identified by the same designations and not specifically explained.

In this embodiment of the invention, the wiring support 6 is equipped with a multilayer rewiring pattern 7 on only one side. This multilayer rewiring pattern 7 has conductor tracks in the various conductor track layers 29, 30, 31 and 32. Arranged between the conductor track layers 29, 30, 31, 32 are insulating layers 33, 34 and 35. Arranged between the conductor track layers 29, 30, 31, 32 are through contacts 46, 47, 48 and 49 through the insulating layers 33, 34, 35, by which the external contacts 5 are connected to the different conductor track layers 29, 30, 31, 32. The outermost conductor track layer 29 is formed such that it has conductive paths 24 on resilient bodies 23 as far as the tips 36 of the elastic external contacts 5. A solder material 37, which is used for connection to the next higher ordered circuit arrangement, can be applied to the elastic external contacts 5.

Figure 4:
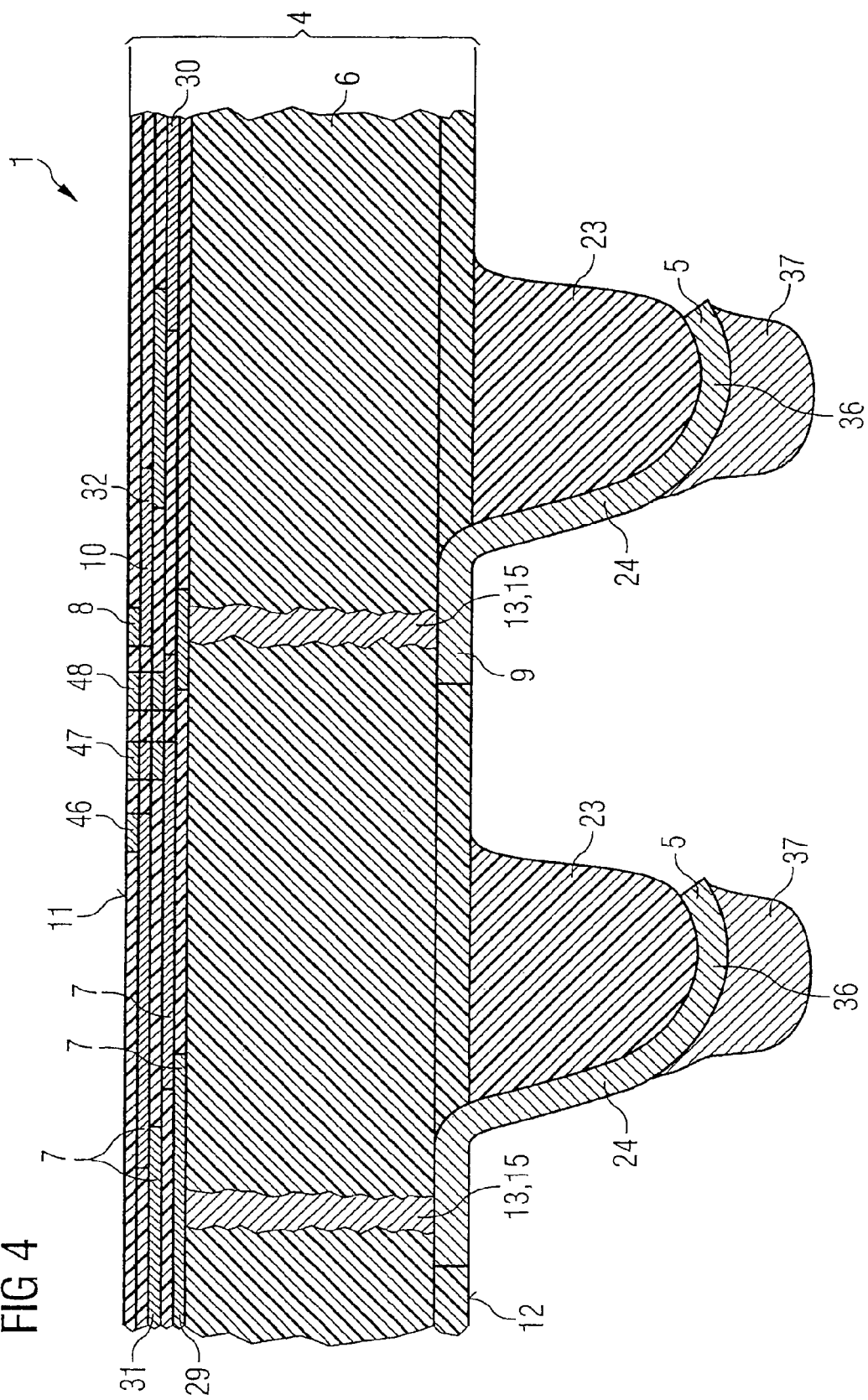
FIG. 4 shows a schematic cross section through a section of an electronic component of a second embodiment of invention.

FIG. 4 shows a schematic cross section through a section of an electronic component 1 of a second embodiment of the invention. Components having the same functions as in the preceding figures are identified by the same designations and not specifically explained.

The substantial difference between the first embodiment of the invention and the second embodiment of the invention, illustrated here, is that on the external contact sides 12 of the insulating plate 6 there is provided only a structured metal layer, while the multilayer rewiring pattern 7 is arranged opposite. A semiconductor chip can be arranged on this multilayer rewiring pattern 7 with its flip-chip contacts on the microscopically small contact connecting areas 8. Between the microscopically small contact connecting areas 8 and the external contact areas 9 there is an electrical connection, once via through contacts 46, 47, 48 in the multilayer rewiring pattern and via through contacts 13, which extend through the insulating plate 50 and are connected to the external contact areas 9. Through contacts 13 of this type through an insulating plate 50 made of silicon or of amorphous glass can be produced in different ways. One of these production possibilities is illustrated in FIGS. 5 to 9.

Figure 5:
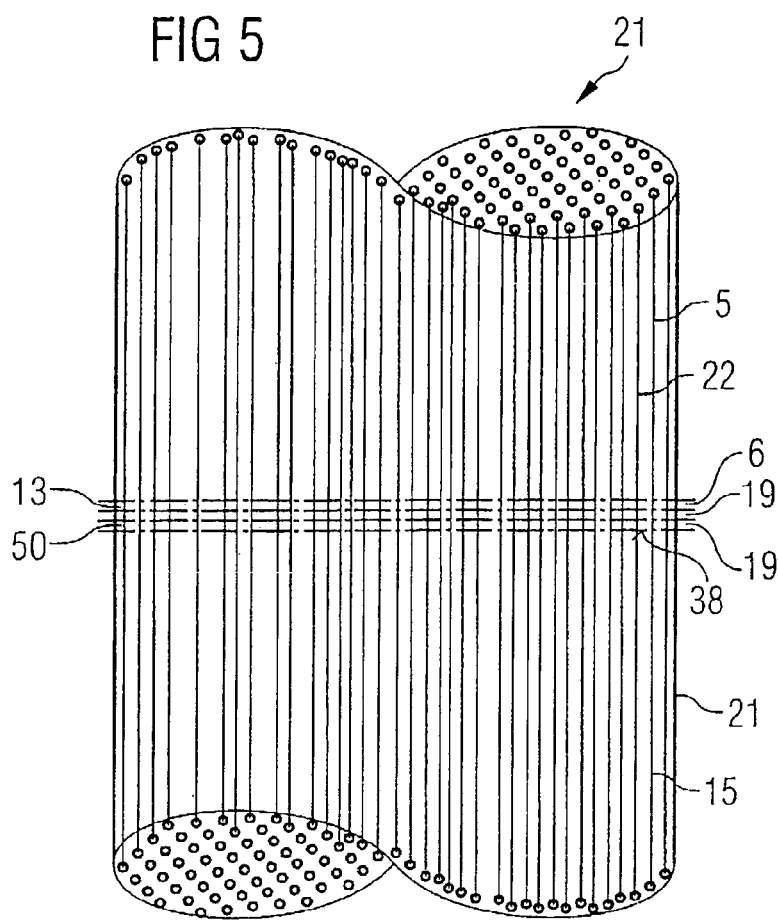
FIG. 5 shows a basic sketch of a detail of a cast pillar having through wires embedded in the longitudinal direction for a rewiring plate.

FIG. 5 shows a basic sketch of a detail of a cast pillar 21 having passage wires 22 embedded in the longitudinal direction for a rewiring plate 4. Components having the same functions as in the preceding figures are identified by the same designations and not specifically explained.

A pillar 21 of this type made of polycrystalline silicon or amorphous glass can be produced in a cylindrical mold, through which metallic wires 15 extend in the longitudinal direction. These metallic wires 15 can be arranged in a matrix with a predetermined grid dimension. By pouring silicon melt or glass melt into the cylindrical mold, following the solidification of the melt, the detail shown in principle in FIG. 5 of a cast pillar 21 having passage wires 22 embedded in the longitudinal direction is formed. For example, since the wires can be positioned relatively closely and the same are a few micrometers in diameter, the grid dimension for through contacts in a wiring support 6 with the aid of this technology can be produced relatively smaller than a grid dimension, which is produced by introducing passage holes through a wiring support 6.

The dash-dotted lines 38 show section tracks for the production of insulating plates 6 having through contacts 13 made of metal wires 15. Thus, a large number of disks 19 for a rewiring plate can be cut from the detail of pillars of insulating plate material as shown in FIG. 5. In this case, the wire material in this embodiment of the invention is a chrome-vanadium steel wire or a chrome-nickel steel wire, if the insulating plate has an amorphous glass, which has melting temperatures between 900 to at most 1200° C., or a chrome-molybdenum steel wire, which also withstands melting temperatures of polysilicon, which begin at 1410° C.

In order to achieve positive anchoring of the wires 15 in the melt, the wires 15 are roughened coarsely on the surface and therefore offer secure retention both in glass and in silicon. Since silicon is a semiconductor, the insulation values are relatively lower than in the case of a glass, so that a typical value for the insulation from wire to wire is around 10 MΩ. If, for specific applications, the insulation values of the silicon are inadequate, insulated wires are used. These wires are then coated with an insulating layer made of silicon carbide, silicon nitride, boron nitride, or silicon oxide.

Alternatively, carbon fibers or graphite fibers can also be used as through contacts. These materials can withstand relatively higher melting temperatures and, from their nature, have a rough surface.

Figure 6:
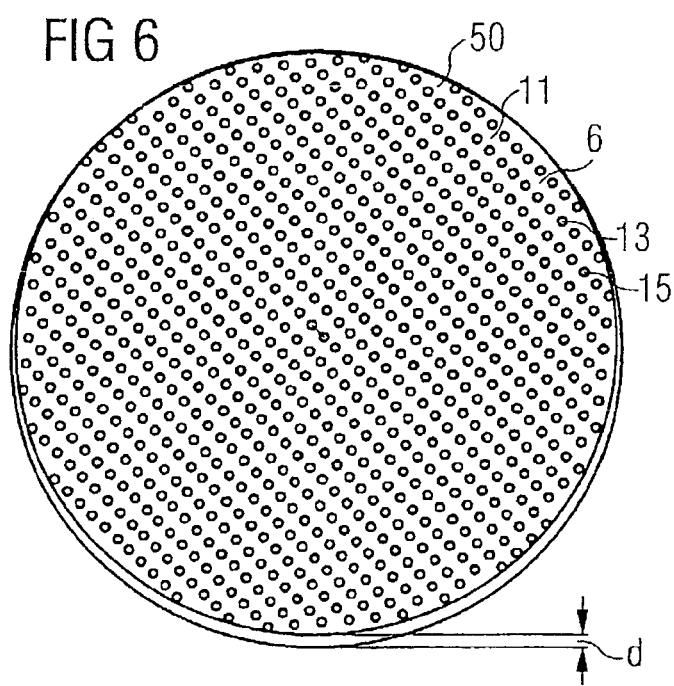
FIG. 6 shows a basic sketch of a wiring support having embedded wires as through contacts.

FIG. 6 shows a basic sketch of an insulating plate 50 having inlaid wires 15 as through contacts 13. Components having the same functions as in the preceding figures are identified by the same designations and not specifically explained.

The insulating plate 50 has a thickness d between 50 and 500 μm and forms the wiring support 6. The metallic wires 15 are arranged in a matrix and pass through the entire thickness d of the insulating plate 50. The upper side 11 can be connected to the underside of the insulating plate 50 electrically and selectively.

FIG. 7 shows a schematic cross section of an insulating plate 50 having embedded wires 15 as through contacts 13. Components having the same functions as in the preceding figures are identified by the same designations and not specifically explained.

This cross section through the insulating plate 50 shows, firstly, the rough surface of the metallic wires 15, which, for this purpose, have specifically been provided with external roughness by etching methods in order to achieve a positive connection with the material of the insulating plate 50. The wires 15 reach from the upper side 11 as far as the underside 12 of the insulating plate 50 as through contacts 13 and, because of their rough surface, are meshed positively with the material of the insulating plate 50 made of polycrystalline silicon or of an amorphous glass.

FIG. 8 shows a schematic cross section of an insulating plate 50 having embedded wires 15 and a multilayer rewiring pattern 7 applied to one side. Components having the same functions as in the preceding figures are identified by the same designations and not specifically explained.

In the multilayer rewiring pattern 7, two conductor track layers have previously been applied here. The conductor track 10 is connected to the through contact 13 and contacts the microscopically small contact connecting area 8. A flip-chip contact of the semiconductor chip can subsequently be applied to this contact connecting area 8.

FIG. 9 shows a bottom view of an insulating plate having embedded through contacts 13. Components having the same functions as in the preceding figures are identified by the same designations and not specifically explained.

These through contacts 13 are arranged at regular intervals in rows and columns in accordance with a predefined grid dimension. An alternative method of producing through contacts 13 in an insulating plate of silicon or amorphous glass is to introduce a matrix of passage holes in a predefined grid dimension into the insulating plate. These passage holes can then be filled with metal to form through contacts.

Passage holes of this type can be introduced both into a silicon wafer and into a glass plate or into a metal plate by using a water jet, which has abrasive additives. As soon as the abrasive supply of sand in the water jet is turned off, even briefly, both the brittle silicon and the brittle glass plate shatter. Using water-jet drilling of this type by abrasive additives, hole diameters between 0.3 mm and 0.5 mm can be produced, which also corresponds approximately to the dimensions of the external contacts. Substantially larger diameters are no problem, but substantially smaller minimum diameters are conditioned by the shape of the geometry of a focusing tube, which is used in water-jet drilling. In this case, the wear on a focusing tube also acts directly on the hole diameter. Thus, for a workpiece or focusing tube of this type, the result is typical service lives, which are in the range of 80–300 hours. This value does not depend just on the abrasive additives, but also on the pressure, the set sand volume, and the possible permissible widening from hole to hole.

With passage times of around 0.5 seconds, silicon wafers having 28,000 holes can be processed successfully in 14,000 seconds. By a parallel arrangement of focusing tubes, a plurality of holes can also be introduced simultaneously, so that the total time for processing a silicon wafer can be shortened accordingly.

Another possible way of introducing passage holes into polycrystalline silicon disks, amorphous glass disks or into metal plates in order subsequently to fill these with metal or with an insulating layer and metal to form insulating through contacts, includes in using a laser. In the production of holes, excimer or Yag lasers can be used, which have a high pulse rate, several thousand pulses per hole being applied. For an entire wafer, 8,000,000 pulses can be expected. Applying passage holes with the aid of lasers as compared with the introduction of passage holes with the aid of water jets with abrasive additives can provide a relatively smaller hole diameter. After hole patterns of this kind have been produced on a wafer, by sputtering on an insulating layer and a seeding layer made of metal, these can be thickened by electrodeposition, filling up the holes produced.

Figure 10:
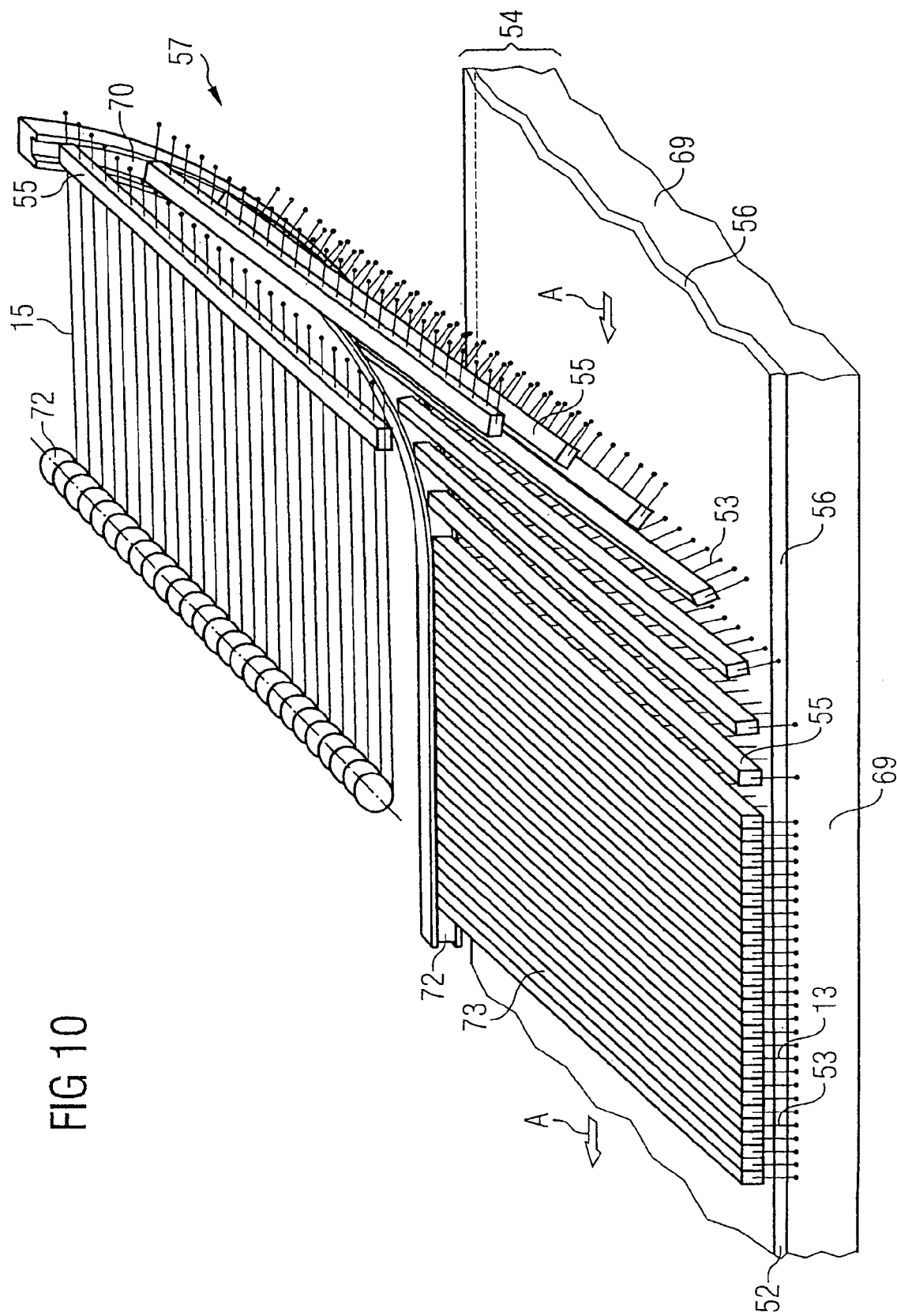
FIG. 10 shows a perspective basic sketch for embedding short wires in a plate glass melt.

FIG. 10 shows a perspective basic sketch for embedding short wires 53 into a plate glass melt 56. Components having the same functions as in the preceding figures are identified by the same designations and not specifically explained.

A plate glass melt 56 is drawn in the direction of arrow A on a molten metal compound in a plate glass production line 57. Before the solidification of the plate glass melt 56 to form rigid plate glass 52, short wires 53 are introduced line by line and column by column into the plate glass melt 56. For this purpose, above the plate glass bed 54 there is arranged a guide frame 70 which, on both sides of the plate glass bed 54, has guide rails 71 in which crossmembers 55 are guided. These crossmembers 55 carry short wires 53 and are introduced into the guide frame 70 above the plate glass melt 56. In this case, appropriate wire lengths for short wires 53 are unwound from wire spools 72 and are held by the crossmember 55, after which the metallic wires 15 from the wire spools 72 are cut off to form short wires 53.

The crossmember 55, which holds the short wires 53 equidistantly, is guided in the guide frame 70 to the guide rails 71, the short wires 53 projecting from the crossmember 55 dipping into the glass melt 56 and passing through the latter, then being initially electrically heated. The short wires 53 are introduced into the plate glass melt 56 such that, before the plate glass melt 56 solidifies, dense packing 73 of crossmembers is produced, so that the equidistantly arranged short wires 53 in the plate glass 52 introduce a matrix of passage wires through the plate glass, which are arranged in rows and columns. After the plate glass 52 has solidified, the crossmembers 55 can be removed from the short wires 53 one after another and fed to the guide frame 70 to be fit with short wires again.

The short wires 53 remain in the plate glass 52. The ends of the short wires 53 projecting out of the plate glass 52 are subsequently etched away, so that a matrix of through contacts 13 remains in the solidified plate glass. Plate glass plates of this type can have widths of several meters, so that the plate glass 52 having the matrix of through contacts 13 can then be divided up into wiring supports for a plurality of components. Using the plate glass production line depicted in FIG. 10, it is thus possible to produce a large number of large-area wiring supports cost-effectively. The wire material used include glass fusing materials, which do not trigger any internal stresses during the solidification process of the glass. They can include chrome-nickel steel, chrome-vanadium steel, chrome-molybdenum steel, or an alloy of copper and molybdenum. These metal alloys can be matched to the plate glass material in terms of their expansion behavior. The surface quality of the plate glass 52 can be increased by polishing the individual wiring supports such that thin film techniques for applying a rewiring pattern become usable.

Given a plate glass width of, for example, 3000 mm and one contact per mm, metallic wires 15 from 3000 wire spools 72 are fed to the crossmember 55 during the population of the crossmember 55. Following the introduction of the wires 15 into the crossmembers 55 as mobile guides, the wires 15 can be nipped off, divided off or cut off to form short wires 53. The mobile guidance in the form of crossmembers 55 is guided along on the guide rails 71 together with the plate glass melt. In the process, a uniform movement of the mobile guides matched to the drawing speed of the plate glass in the direction A is achieved before the solidification of the plate glass 52 and after the short wires 53 have dipped into the plate glass melt 56. During the population of the crossmembers or of the mobile guides, these have to be stopped for a short time before they join the dense packing 73 of the mobile guides in the form of crossmembers 55.

FIG. 11 shows a schematic cross section through an electronic component 1 having a wiring support 6 made of metal. Components having the same functions as in the preceding figures are identified by the same designations and not specifically explained.

The embodiment according to FIG. 11 differs from the embodiments as illustrated in the preceding figures substantially in the fact that the wiring support is a metal and not a nonmetal. The designation 59 thus identifies a metal plate. This metal plate 59 is insulated from the rewiring pattern 7 by an additional insulating layer 51. In this embodiment according to FIG. 11, both the elastic external contacts 5 and the semiconductor chips 2 are arranged on the same upper side of the rewiring plate 4 which bears the rewiring pattern 7. The dash-dotted line 65 identifies the upper limit of a circuit board 17, which has a primary circuit and on which the electronic component 1 is to be arranged. In this case, the semiconductor chip 25 forms a stopper, so that the height of the elastic external contact 5 and the contact pressure on the elastic external contact 5 during the application to the contact connecting area 27 of the circuit board 17 is limited.

With a metallic wiring support, high strength of metal plate 59 and the possibility of matching the thermal expansion behavior of the metal plate 59 to the expansion behavior of the semiconductor chip 2 are possible. For this purpose, metal plates made of INVAR alloys, which have nickel/iron alloys, are suitable with the Ni/Fe mixture ratio determining the expansion coefficient. The expansion coefficient of this alloy can be set between 1 and 10 ppm/° K. In this case, an expansion coefficient for the metal plate 60 is selected which is equal to or greater than the expansion coefficient of the semiconductor chip material. The expansion coefficient of the INVAR alloy should not exceed 1.5 times the expansion coefficient of the semiconductor chip.

Another alloy which the metal plate 60 can have is PERNIFER, which has 41% by weight of nickel, 0.6% by weight of magnesium, 0.15% by weight of silicon, and 0.005% by weight of carbon; the rest being iron.

Furthermore, with metal plates as wiring supports, their surfaces can be polished relatively precisely so that the roughness lies in the submicrometer range and the deflection can be less than 100 μm, since it is possible to achieve a thickness tolerance of about 10 μm. This surface quality and these deflection and thickness tolerances can also be achieved with wiring supports made of amorphous glass or of polycrystalline silicon but not with glass fiber reinforced circuit boards.

In this embodiment of the invention, the metal plate 59 has an alloy of molybdenum and copper, 70% by weight of molybdenum, and 30% by weight of copper in the alloy. Furthermore, the metal plate can also include an alloy of tungsten and copper, it being possible for the copper content to be varied between 10 and 40% by weight and for the achievable expansion coefficients to lie in the region of 6 ppm/° C.

FIGS. 12 to 17 show schematic results of producing a rewiring plate 4 having through contacts 13 through a metal wiring support 6. Components having the same functions as in the preceding figures are identified by the same designations and not specifically illustrated.

FIG. 12 shows a schematic cross section of the rewiring plate 4 having a rewiring pattern 7 on a metal plate 59. This metal plate 59 has the same metal alloys, matched to the semiconductor chip in terms of their thermal expansion behavior, as have already been explained for FIG. 11. As opposed to the cross section shown in FIG. 11, the rewiring plate 4 based on a metal plate 59 with a rewiring pattern 7 has no closed insulating layer 51, but instead a structured insulating layer 51 which has metallic through contacts 58 to the metal plate 59. The multilayer conductor track pattern of the rewiring pattern 7 is otherwise constructed in exactly the same way as in FIG. 11. From the surface 60 of the metallic wiring support 6 lying opposite the rewiring pattern 7, a passage hole to the through contact 58 is to be created in the structured insulating layer 51 in a next step.

FIG. 13 shows a schematic cross section of the rewiring board 4 with an etching mask 67 and an etched passage hole 14 for making a through contact. The etching mask 67, made of photoresist, has a passage opening 74 which, on the side 60 of the metal plate 59, is located opposite the through contact 58 in the structured insulating layer 51. In an isotropic wet etching method, a passage hole 14 is etched into the metal plate 59, and therefore the through contact 58 is exposed. For this purpose, the through contact 58 can have a coating which triggers an etch stop at the surface of the through contact 58 for the etching solution which penetrates through the passage opening 74.

FIG. 14 shows a schematic cross section of the rewiring plate 4 of FIG. 13 following removal of the etching mask. The removal of the etching mask can be removed by appropriate incineration in a plasma oven or by dissolution in a solution bath. Following the removal of the mask 67, access can be made to the through contact 58.

Figure 15:
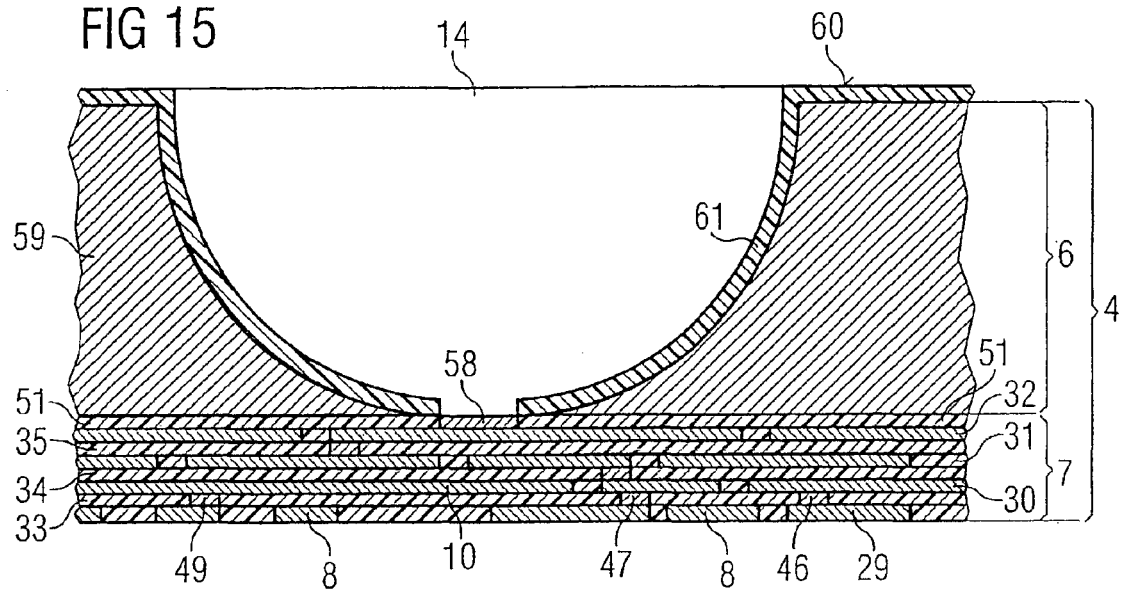

FIG. 15 shows a schematic cross section of the rewiring plate 4 following the application of a structured insulating layer 61. This insulating layer 61 is structured such that the surface of the through contact 58 in the through hole 14 remains free of the insulating layer 61.

Figure 16:
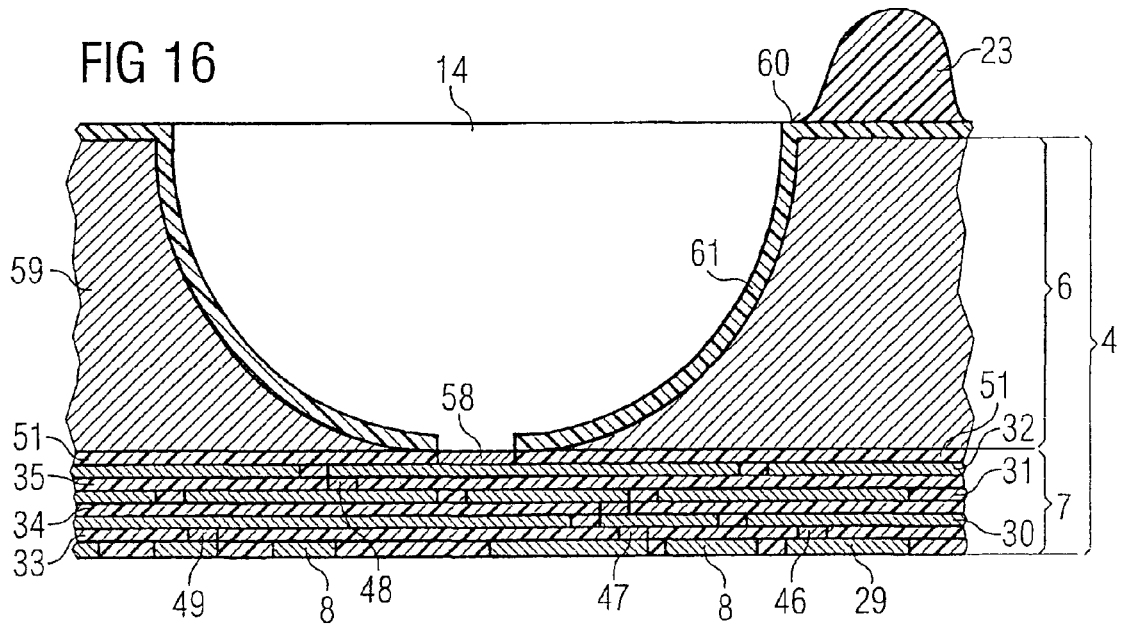

FIG. 16 shows a schematic cross section of the rewiring plate 4 following the application of an elastic body 23 for an external contact 5. This elastic body 23, made of resilient material, can be arranged in the immediate vicinity of the passage hole 14 on the insulating layer 61 on the side 16 of the metal plate 59 opposite the rewiring pattern 7.

Figure 17:
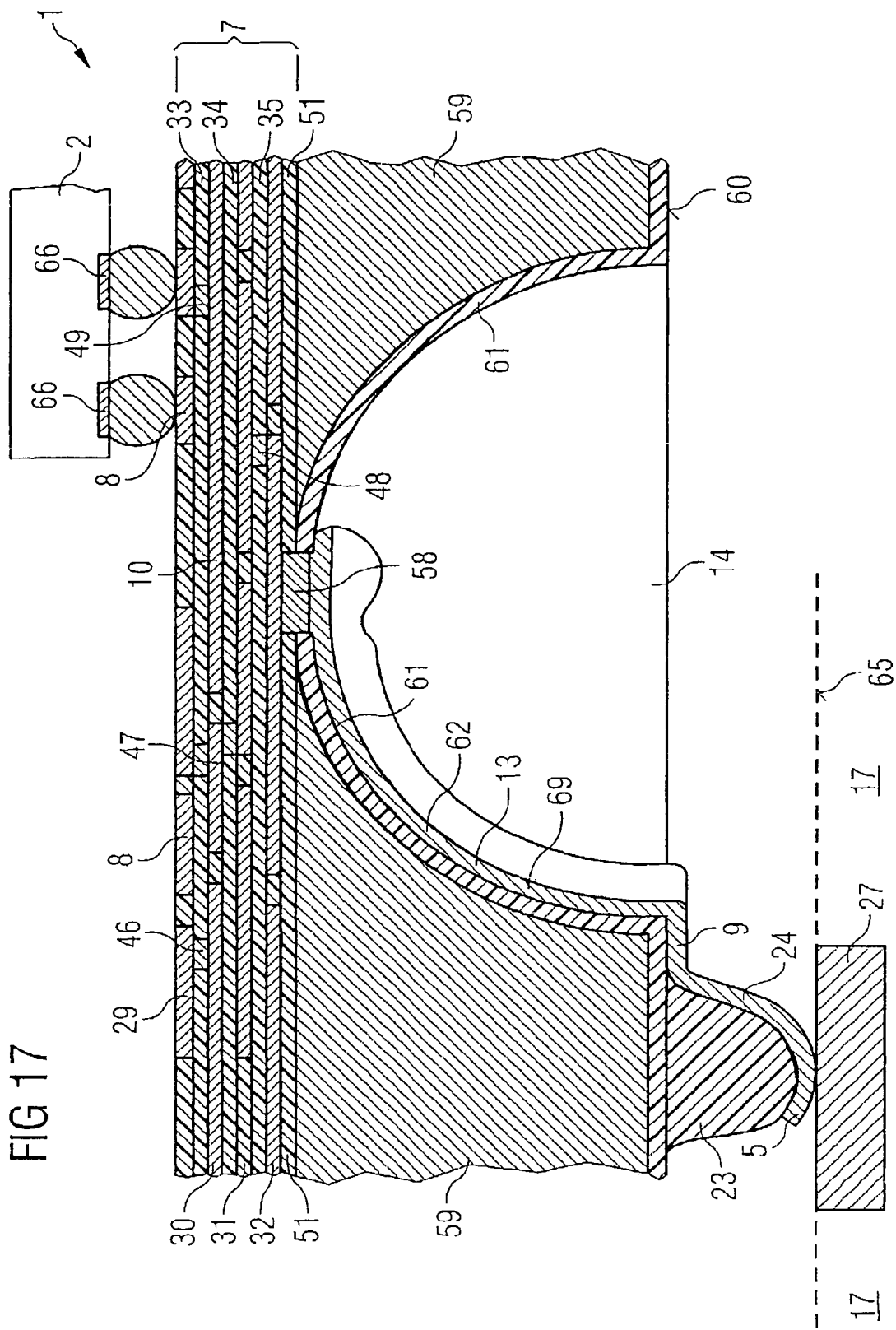

FIG. 17 shows a cross section of the rewiring plate 4 following the application of a structured metal layer 62 for forming elastic external contacts 5. The structuring of the initially closed metal layer applied to form a structured metal layout 62 can be carried out by projection photolithography. In this case, a through contact line 69 is formed, which is insulated completely from the metal plate 59 by the insulating layer 61. The through contact line 63 is adjoined by a conduction path 24, which is formed on the elastic body 23 and merges into the external contact 5 at the tip 36 of the elastic body 23. Following the fabrication of the structured metal layer 62, the semiconductor chip 2 can be applied to the rewiring pattern 7 in the flip-chip technique with its flip-chip contacts 3 on the microscopically small contact connecting areas 8.

Such an electronic can be applied to a circuit board 17, whose surface is indicated by the dashed line 65, where the elastic external contacts 5 are connected to contact connecting areas 27 of the circuit board 17. Whereas, in this embodiment of the electronic component according to FIG. 17, the passage holes 14 through a metal plate are achieved by wet etching technology, substantially smaller passage holes can be produced if, instead of the wet etching, dry etching with the aid of a reactive plasma is carried out. In this case, the diameter of the passage hole 14 can be restricted to the diameter of the through contact 58. Thus, substantially higher external contact densities can be achieved.

Figure 18:
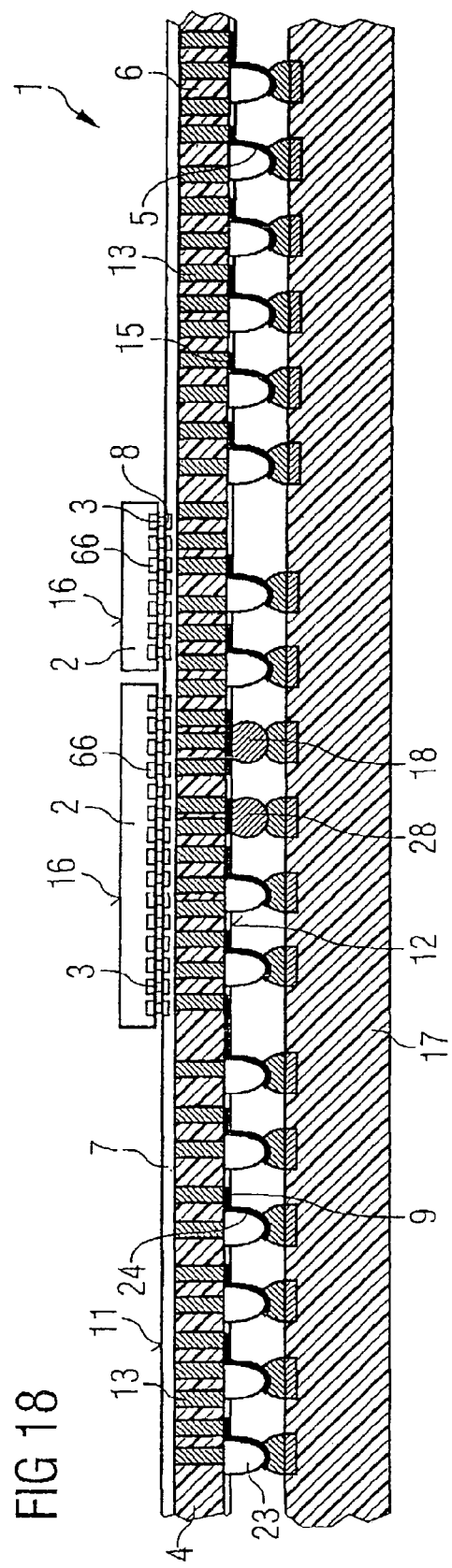
FIG. 18 shows a schematic cross section through an electronic component of the second embodiment of the invention.

FIG. 18 shows a schematic cross section through an electronic component 1 of the second embodiment of the invention. Components having the same functions as in the preceding figures are identified by the same designations and not specifically explained.

In the second embodiment of the invention, as mentioned above, the semiconductor chip 2 is arranged on one side of the rewiring plate 4 and the elastic external contacts 5 are arranged on the other side or opposite side of the rewiring plate 4. In this case, a multilayer rewiring layer 7 distributes the microscopically small contact connecting areas 8 under each of the semiconductor chips 2 to the entire area of a wiring support 6, which has a large number of through contacts 13 which have been introduced by one of the techniques specified above. On the side or surface of the wiring support 6 located opposite the semiconductor chip 2, the elastic external contacts 5 are arranged, which are connected electrically to at least one of the through contacts 13 via contact areas 9 and/or additional conductor tracks.

This embodiment of the invention makes it possible to accommodate substantially more external contacts 5 on the same area than in the first embodiment. Furthermore, the stopper used can be a number of rigid solder balls 18, which simultaneously fulfill an electrical connecting function. These stoppers 18 limit the height to which the elastic external contacts 5 can be compressed during mounting on a circuit board 17. Furthermore, the rigid external contacts 18 arranged as a stopper in the center of the electronic component fix the center of the electronic component 1 with respect to the circuit arrangement on the circuit board 17.

Figure 19:
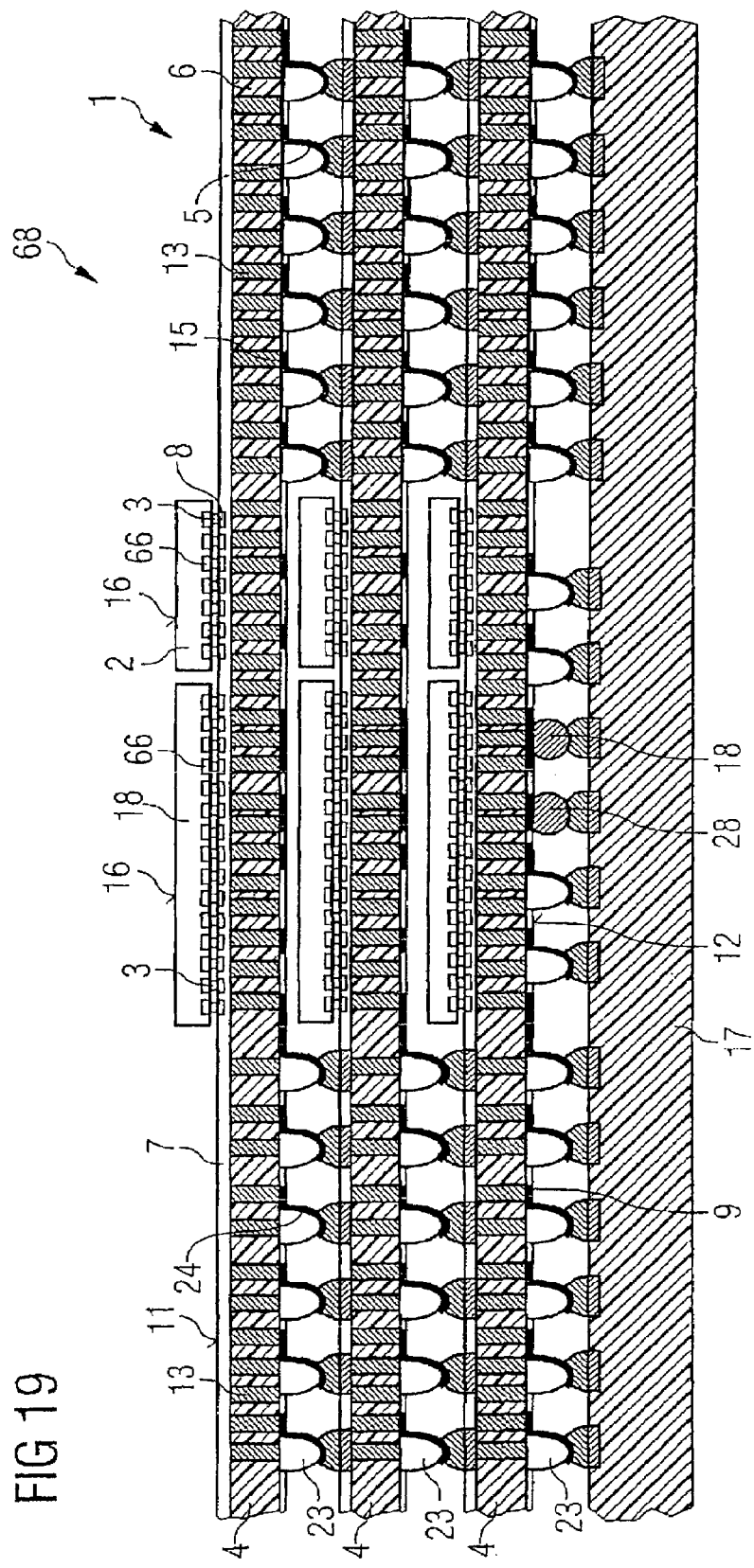
FIG. 19 shows a schematic cross section through an electronic vertically stacked component.

FIG. 19 shows a schematic cross section through a vertically stacked electronic component 68. Components having the same functions as in the preceding figures are identified by the same designations and not specifically explained.

The stacked component 68 has a plurality of electronic components which are arranged one above another and have through contacts 13 in their wiring supports 6. In addition, on the side of the rewiring plate, the individual electronic components 1 from which the stacked electronic component 68 is composed have additional external contact areas 9, on which corresponding elastic external contacts 5 of the next higher electronic component 1 can be arranged and connected electrically.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for the production of a wiring support from nonmetals with embedded metallic wires as through contacts, the method comprising:
   introducing a matrix of wires in the longitudinal direction in a grid dimension provided in an elongated, pillar-like mold;
   potting the wires in the mold with a melt of glass or highly pure silicon; and
   dividing the solidified potting compound into disks transversely with respect to the longitudinal extent of the wires to form insulating plates having through contacts.

2. A method for the production of a wiring support from plate glass with embedded metallic wires as through contacts, the method comprising:
   introducing short wires continuously row by row into a molten plate glass bed while guiding along crossmembers, the crossmembers being fit with short wires and from which the short wires project and which project through the plate glass melt;
   removing the crossmembers from the embedded short wires during plate glass production and feeding the cross members back to be fitted with short wires;
   etching away the ends of the short wires projecting from the solidified plate glass on both sides; and
   dividing the plate glass into wiring supports for a plurality of electronic components.

3. The method as claimed in claim 1, wherein before being embedded in a wiring support of nonmetals, the metallic wires are roughened on the surface.

4. The method as claimed in claim 2, wherein before being embedded in a wiring support of plate glass, the metallic wires are roughened on the surface.

5. The method as claimed in claim 2, wherein introducing passage holes is by laser drilling.

* * * * *